(12) United States Patent
Hiew et al.

(10) Patent No.: US 7,830,666 B2
(45) Date of Patent: Nov. 9, 2010

(54) MANUFACTURING PROCESS FOR SINGLE-CHIP MMC/SD FLASH MEMORY DEVICE WITH MOLDED ASYMMETRIC CIRCUIT BOARD

(75) Inventors: Siew S. Hiew, San Jose, CA (US); Jim C. Ni, San Jose, CA (US); Paul Hsueh, Concord, CA (US); Charles C. Lee, Cupertino, CA (US); Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 689 days.

(21) Appl. No.: 11/831,888

(22) Filed: Jul. 31, 2007

(65) Prior Publication Data
US 2008/0006927 A1   Jan. 10, 2008

Related U.S. Application Data

(63) Continuation-in-part of application No. 11/773,830, filed on Jul. 5, 2007, which is a continuation-in-part of application No. 11/309,594, filed on Aug. 28, 2006, now Pat. No. 7,383,362, and a continuation-in-part of application No. 10/707,277, filed on Dec. 2, 2003, now Pat. No. 7,103,684, application No. 11/831,888, which is a continuation-in-part of application No. 11/466,759, filed on Aug. 23, 2006, now Pat. No. 7,702,831, which is a continuation-in-part of application No. 09/478,720, filed on Jan. 6, 2000, now Pat. No. 7,257,714, application No. 11/831,888, which is a continuation-in-part of application No. 11/458,987, filed on Jul. 20, 2006, now Pat. No. 7,690,030, which is a continuation-in-part of application No. 10/761,853, filed on Jan. 20, 2004, now abandoned, application No. 11/831,888, which is a continuation-in-part of application No. 10/789,333, filed on Feb. 26, 2004, now Pat. No. 7,318,117, and a continuation-in-part of application No. 11/624,667, filed on Jan. 18, 2007, which is a continuation-in-part of application No. 10/913,868, filed on Aug. 6, 2004, now Pat. No. 7,264,992, application No. 11/831,888, which is a continuation-in-part of application No. 11/309,844, filed on Oct. 11, 2006, now Pat. No. 7,535,088.

(51) Int. Cl.
*H05K 7/02* (2006.01)
*H05K 3/28* (2006.01)

(52) U.S. Cl. .............. 361/737; 361/752; 257/679; 174/521; 29/830

(58) Field of Classification Search .............. 361/737, 361/752, 730, 736; 257/679; 174/520, 521; 29/830
See application file for complete search history.

(56) References Cited

U.S. PATENT DOCUMENTS 5,397,857 A   3/1995   Farquhar et al.

(Continued)

OTHER PUBLICATIONS

USB FlashCard "Main Body Dimensions", "Top View", "Bottom View" Web pages, Lexar, 2004, 3 pages.
USB 'A' Plug Form Factor, Revision 0.9, Guideline for Embedded USB Device Applications, Nov. 29, 2004, 4 pages.

*Primary Examiner*—Dameon E Levi
(74) *Attorney, Agent, or Firm*—Bever, Hoffman & Harms, LLP; Patrick T. Bever

(57) ABSTRACT

An MMC/SD core unit includes a PCBA in which all passive components and unpackaged IC chips are attached to a single side of a PCB opposite to the metal contacts. The IC chips include, for example, a controller chip and a flash memory chip, or a single-chip (combined controller/flash memory) chip. Multiple flash IC chips are optionally stacked to increase storage capacity. The IC chip(s) are attached to the PCB by wire bonding or other chip-on-board (COB) technique. The passive components are attached by conventional surface mount technology (SMT) techniques. A molded housing is then formed over the IC chips and passive components such that the device has a uniform thickness. The MMC/SD core unit is then inserted or otherwise mounted in an eternal casing to provide a finished MMC/SD device.

17 Claims, 14 Drawing Sheets

U.S. PATENT DOCUMENTS

| | | | |
|---|---|---|---|
| 5,404,485 | A | 4/1995 | Ban |
| 5,414,597 | A | 5/1995 | Lindland et al. |
| 5,430,859 | A | 7/1995 | Norman et al. |
| 5,479,638 | A | 12/1995 | Assar et al. |
| 5,623,552 | A | 4/1997 | Lane |
| 5,835,760 | A | 11/1998 | Harmer |
| 5,959,541 | A | 9/1999 | DiMaria et al. |
| 6,000,006 | A | 12/1999 | Bruce et al. |
| 6,012,636 | A | 1/2000 | Smith |
| 6,044,428 | A | 3/2000 | Rayabhari |
| 6,069,920 | A | 5/2000 | Schulz et al. |
| 6,125,192 | A | 9/2000 | Bjorn et al. |
| 6,148,354 | A | 11/2000 | Ban et al. |
| 6,193,152 | B1 | 2/2001 | Fernando et al. |
| 6,292,863 | B1 | 9/2001 | Terasaki et al. |
| 6,297,448 | B1 | 10/2001 | Hara |
| 6,313,400 | B1 | 11/2001 | Mosquera et al. |
| 6,321,478 | B1 | 11/2001 | Klebes |
| 6,438,638 | B1 | 8/2002 | Jones et al. |
| 6,444,501 | B1 | 9/2002 | Bolken |
| 6,462,273 | B1 | 10/2002 | Corisis et al. |
| 6,475,830 | B1 | 11/2002 | Brillhart |
| 6,570,825 | B2 | 5/2003 | Miranda et al. |
| 6,573,567 | B1 * | 6/2003 | Nishizawa et al. .......... 257/358 |
| 6,580,615 | B1 | 6/2003 | Nakanishi et al. |
| 6,615,404 | B1 | 9/2003 | Garfunkel et al. |
| 6,624,005 | B1 | 9/2003 | DiCaprio et al. |
| 6,671,808 | B1 | 12/2003 | Abbott et al. |
| 6,676,420 | B1 | 1/2004 | Liu et al. |
| 6,718,407 | B2 | 4/2004 | Martwick |
| 6,733,329 | B2 | 5/2004 | Yang |
| 6,740,964 | B2 | 5/2004 | Sasaki |
| 6,757,783 | B2 | 6/2004 | Koh |
| 6,763,410 | B2 | 7/2004 | Yu |
| 6,773,192 | B1 | 8/2004 | Chao |
| 6,778,401 | B1 | 8/2004 | Yu et al. |
| 6,832,281 | B2 | 12/2004 | Jones et al. |
| 6,922,343 | B2 * | 7/2005 | Nakanishi et al. .......... 361/737 |
| 6,924,547 | B2 | 8/2005 | Kanemoto et al. |
| 6,940,153 | B2 | 9/2005 | Spencer et al. |
| 7,048,197 | B2 * | 5/2006 | Nishizawa et al. .......... 235/492 |
| 7,055,757 | B2 * | 6/2006 | Nishizawa et al. .......... 235/492 |
| 7,059,871 | B1 * | 6/2006 | Hsiao ........................ 439/76.1 |
| 7,089,661 | B2 | 8/2006 | Fong et al. |
| 7,224,052 | B2 * | 5/2007 | Nishizawa et al. .......... 257/679 |
| 7,234,644 | B2 * | 6/2007 | Nishizawa et al. .......... 235/492 |
| 7,375,975 | B1 * | 5/2008 | Jang et al. .................... 361/752 |
| 7,547,961 | B2 * | 6/2009 | Nishizawa et al. .......... 257/679 |
| 7,616,447 | B2 * | 11/2009 | Yamada et al. .............. 361/737 |
| 2001/0043174 | A1 | 11/2001 | Jacobsen et al. |
| 2002/0036922 | A1 | 3/2002 | Roohparvar |
| 2002/0116668 | A1 | 8/2002 | Chhor et al. |
| 2002/0166023 | A1 | 11/2002 | Nolan et al. |
| 2002/0186549 | A1 | 12/2002 | Bolken |
| 2003/0038043 | A1 | 2/2003 | Painsith |
| 2003/0046510 | A1 | 3/2003 | North |
| 2003/0163656 | A1 | 8/2003 | Ganton |
| 2003/0177300 | A1 | 9/2003 | Lee et al. |
| 2003/0182528 | A1 | 9/2003 | Ajiro |
| 2003/0198028 | A1 * | 10/2003 | Nakanishi et al. .......... 361/737 |
| 2004/0034765 | A1 | 2/2004 | James |
| 2004/0066693 | A1 | 4/2004 | Osako |
| 2004/0087213 | A1 | 5/2004 | Kao |
| 2004/0137664 | A1 | 7/2004 | Elazar et al. |
| 2004/0143716 | A1 | 7/2004 | Hong |
| 2004/0148482 | A1 | 7/2004 | Grundy et al. |
| 2004/0153595 | A1 | 8/2004 | Sukegawa et al. |
| 2004/0255054 | A1 | 12/2004 | Pua et al. |
| 2005/0009388 | A1 | 1/2005 | Chao |
| 2005/0114587 | A1 | 5/2005 | Chou et al. |
| 2005/0182858 | A1 | 8/2005 | Lo et al. |
| 2005/0193161 | A1 | 9/2005 | Lee et al. |
| 2005/0193162 | A1 | 9/2005 | Chou et al. |
| 2005/0216624 | A1 | 9/2005 | Deng et al. |
| 2005/0218200 | A1 | 10/2005 | Focke et al. |
| 2005/0254219 | A1 * | 11/2005 | Nakanishi et al. .......... 361/737 |
| 2007/0263365 | A1 * | 11/2007 | Yamada et al. .............. 361/737 |

\* cited by examiner

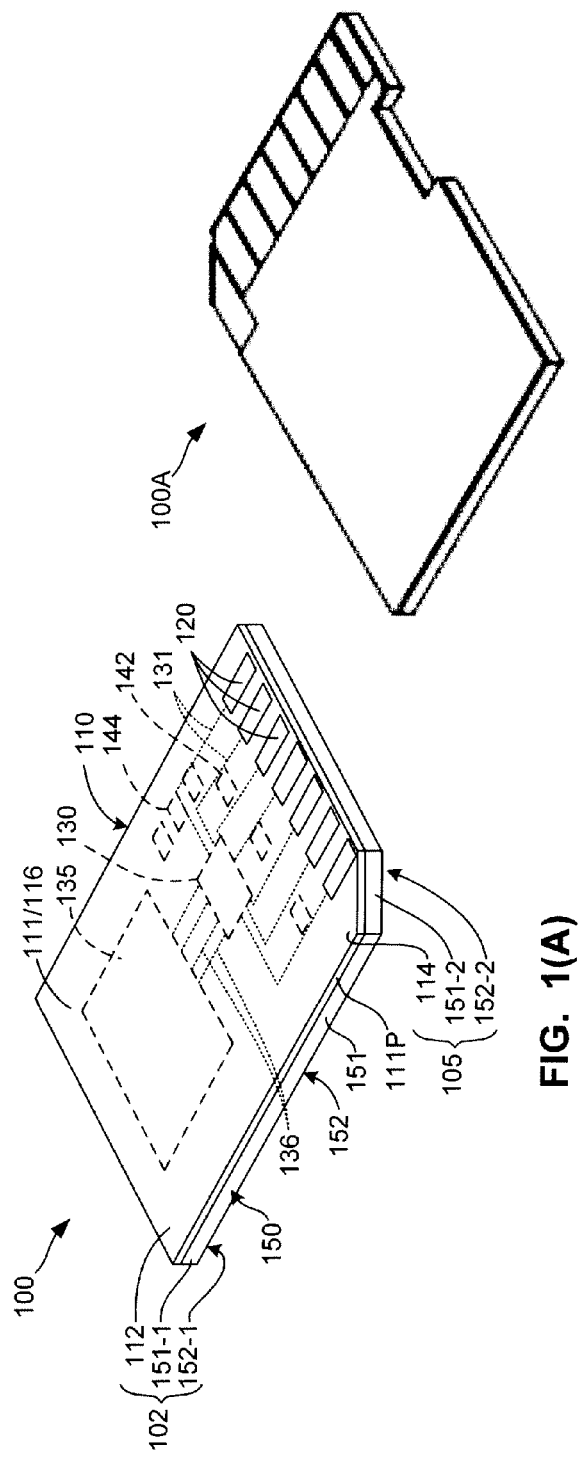
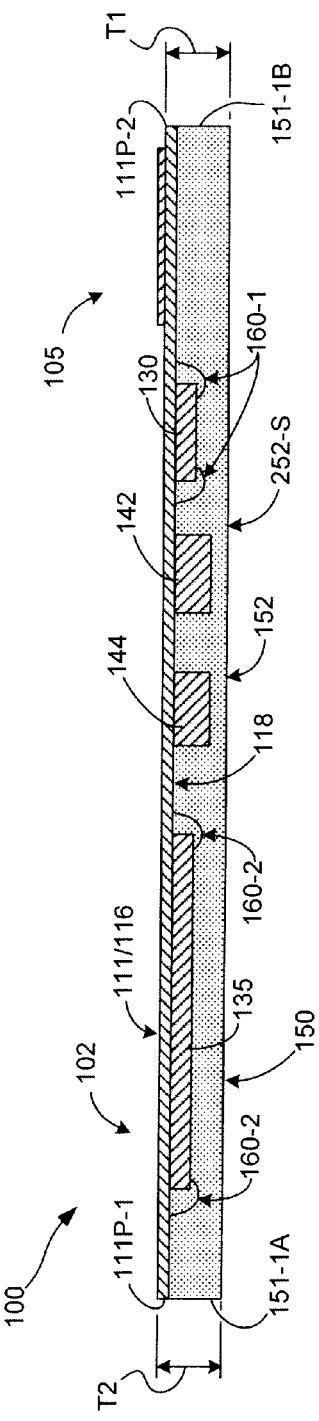
FIG. 1(A)
FIG. 1(B)
FIG. 2

MANUFACTURING PROCESS FOR SINGLE-CHIP MMC/SD FLASH MEMORY DEVICE WITH MOLDED ASYMMETRIC CIRCUIT BOARD

RELATED APPLICATIONS

This application is a continuation-in-part (CIP) of U.S. patent application for "Molding Methods To Manufacture Single-Chip Chip-On-Board USB Device", U.S. application Ser. No. 11/773,830, filed Jul. 5, 2007, which is a continuation-in-part (CIP) of U.S. patent application for "Single-Chip Multi-Media Card/Secure Digital (MMC/SD) Controller Reading Power-On Boot Code from Integrated Flash Memory for User Storage", U.S. application Ser. No. 11/309,594, filed Aug. 28, 2006, which is a CIP of "Single-Chip USB Controller Reading Power-On Boot Code from Integrated Flash Memory for User Storage", U.S. application Ser. No. 10/707,277, filed Dec. 2, 2003, now U.S. Pat. No. 7,103,684.

This application is also a CIP of U.S. patent application for "Flash Memory Controller for Electronic Data Flash Card", U.S. application Ser. No. 11/466,759, filed Aug. 23, 2006, which is a continuation-in-part of U.S. patent application for "Electronic Data Storage Medium with Fingerprint Verification Capability", U.S. application Ser. No. 09/478,720 filed Jan. 6, 2000.

This application is also a CIP of U.S. patent application for "ELECTRONIC DATA FLASH CARD WITH FINGERPRINT VERIFICATION CAPABILITY", U.S. application Ser. No. 11/458,987 filed Jul. 20, 2006, which is a continuation-in-part of U.S. Patent application for "ELECTRONIC DATA STORAGE MEDIUM WITH FINGERPRINT VERIFICATION CAPABILITY", U.S. application Ser. No. 09/478,720, filed Jan. 6, 2000, and a continuation-in-part of U.S. patent application for "HIGHLY INTEGRATED MASS STORAGE DEVICE WITH AN INTELLIGENT FLASH CONTROLLER", U.S. application Ser. No. 10/761,853, filed Jan. 20, 2004.

This application is also a CIP of U.S. patent application for "System and Method for Controlling Flash Memory", U.S. application Ser. No. 10/789,333 filed Feb. 26, 2004.

This application is also a CIP of U.S. patent application for "Electronic Data Storage Medium with Fingerprint Verification Capability", U.S. application Ser. No. 11/624,667, filed on Apr. 21, 2005, which is a division of application Ser. No. 09/478,720 filed on Jan. 6, 2000.

This application is also a CIP of U.S. patent application for "Removable Flash Integrated Method Memory Module Card and Method of Manufacture", U.S. application Ser. No. 10/913,868, filed on Aug. 6, 2004.

This application is also a CIP of U.S. patent application for "Secure-Digital Flash Card with Slanted Asymmetric Circuit Board", U.S. application Ser. No. 11/309,844, filed on Oct. 11, 2006.

FIELD OF THE INVENTION

This invention relates to portable electronic devices, and more particularly to portable electronic devices such as those that utilize the Secure Digital (SD) and Multi-Media Card (MMC) specifications.

BACKGROUND OF THE INVENTION

Rapid advances in technology in several areas have converged to enable small, portable memory cards with vast capacities. Flash memory technologies such as those using electrically-erasable programmable read-only memory (EEPROM) have produced chips storing 128 M-Bytes or more. Small flash-memory cards have been designed that have a connector that can plug into a specialized reader, such as for compact-flash, Secure Digital, Multi-Media Card (MMC) memory stick, or other standardized formats. Both MMC and SD cards have a form factor that is approximately 24 mm wide, 32 mm long, and 1.4 mm or 1.5 mm thick, and are substantially rectangular except for a chamfer formed in one corner, which defines the front end of the card that is inserted into a card-hosting device. Both the MMC and SD card's contact pads are exposed on its lower surface of each card near the front end. Due to the similarities between the MMC and SD form factors and construction, MMC and SD cards are collectively referred to herein as "MMC/SD" cards unless separately specified.

Present MMC/SD memory card manufacturing mainly uses standard surface-mount-technology (SMT) or chip-on-board (COB). Using SMT method to mount electronic components on printed-circuit-board (PCB) has the disadvantage of thickness limitation because the flash memory and controller chips have thickness that is limited by the chip packaging dimension's physical limitation. Also, it would be too costly to stack "packaged" IC chips and it would not be practical at present as both MMC and SD have its own shape, form, standard XY dimensions and thickness. Combining COB assembly methods and plastic molding methods has the disadvantage of plastic flash spilling over the connector pins, which causes poor electrical contact. Also, it is hard to mold multiple PCBA simultaneously per single shot molding.

What is needed is an efficient method for producing MMC/SD devices that avoids the problems associated with conventional methods.

SUMMARY OF THE INVENTION

The present invention is directed to a method for producing MMC/SD flash memory devices in which electronic and other components are mounted only on a lower surface of a PCB, which is opposite to the metal contacts, and then encapsulating the components in a molded plastic housing that is formed only on the lower PCB surface, thereby producing a standardized core unit that contains all of the electronics of a functional MMC/SD flash memory card. These standardized core units are then inserted into an external casing, which are formed separately, to produce the final MMC/SD flash memory devices for end users. Mounting the components only on a side the PCB that is opposite to the metal contacts facilitates a simplified molding process that avoids the undesirable formation of plastic flash on the metal contacts, thereby providing superior electrical contact. Thus, this invention provides a low cost alternative solution to volume manufacturing of highly reliable MMC and SD flash memory devices.

According to an aspect of the invention, passive components are mounted onto the PCB using one or more standard surface mount technology (SMT) techniques, and one or more integrated circuit (IC) die (e.g., a controller IC die and a flash memory die) are mounted using chip-on-board (COB) techniques. During the SMT process, the SMT-packaged passive components (e.g., capacitors, oscillators, and light emitting diodes) are mounted onto contact pads disposed on the PCB, and then known solder reflow techniques are utilized to connect leads of the passive components to the contact pads. During the subsequent COB process, the IC dies are secured onto the PCB using know die-bonding techniques, and then electrically connected to corresponding contact pads using, e.g., known wire bonding techniques. By combining SMT and COB manufacturing techniques to produce MMC/SD devices, the present invention provides several advantages over conventional manufacturing methods that utilize SMT techniques only. First, by utilizing COB techniques to mount the controller and flash memory, the PCB area typically taken up by SMT-packaged controllers and flash devices is dramatically reduced, along with the interconnection lengths and resistance, thereby facilitating the use of larger (i.e., greater capacity) flash memory chips and better device performance. Second, the IC die height is much smaller than that of packaged ICs (needed for SMT), thereby facilitating stacked memory arrangements that greatly increase memory capacity of the SD devices without increasing the SD device footprint. Further, overall manufacturing costs are reduced and assembly throughput is increased by utilizing unpackaged controllers and flash devices (i.e., by eliminating the cost associated with SMT-package normally provided on the controllers and flash devices).

After the COB process is completed, the plastic housing is formed over the passive components and IC dies using plastic molding techniques. The molded housing provides greater moisture and water resistance and higher impact force resistance than that achieved using conventional manufacturing methods. Yet another benefit associated with the present invention is that the over-molding process reduces plastic packaging requirements. Therefore, the combined COB and SMT method according to the present invention provides a less expensive and higher quality (i.e., more reliable) memory product with a smaller size than that possible using conventional SMT-only manufacturing methods.

According to an embodiment of the invention, an MMC/SD core unit utilizes a single-chip controller/flash die that includes both a controller circuit and one or more flash block mass storage circuits that are interconnected by a bus. The controller circuit includes an input/output (I/O) interface circuit that facilitates sending and receiving commands and data to/from a host, and a flash-memory controller that facilitates sending and receiving sends data over the internal bus to/from the flash mass storage blocks. By combining the controller and flash memory circuits, external pins are not required, thereby further reducing the PCB area required for controller and flash memory devices.

BRIEF DESCRIPTION OF THE DRAWINGS

These and other features, aspects and advantages of the present invention will become better understood with regard to the following description, appended claims, and accompanying drawings, where:

FIGS. 1(A) and 1(B) are perspective top views showing simplified exemplary MMC and SD core units, respectively, according to an embodiment of the present invention;

FIG. 2 is a simplified cross sectional side view showing the MMC core unit of FIG. 1(A);

DETAILED DESCRIPTION OF THE DRAWINGS

Figure 3:
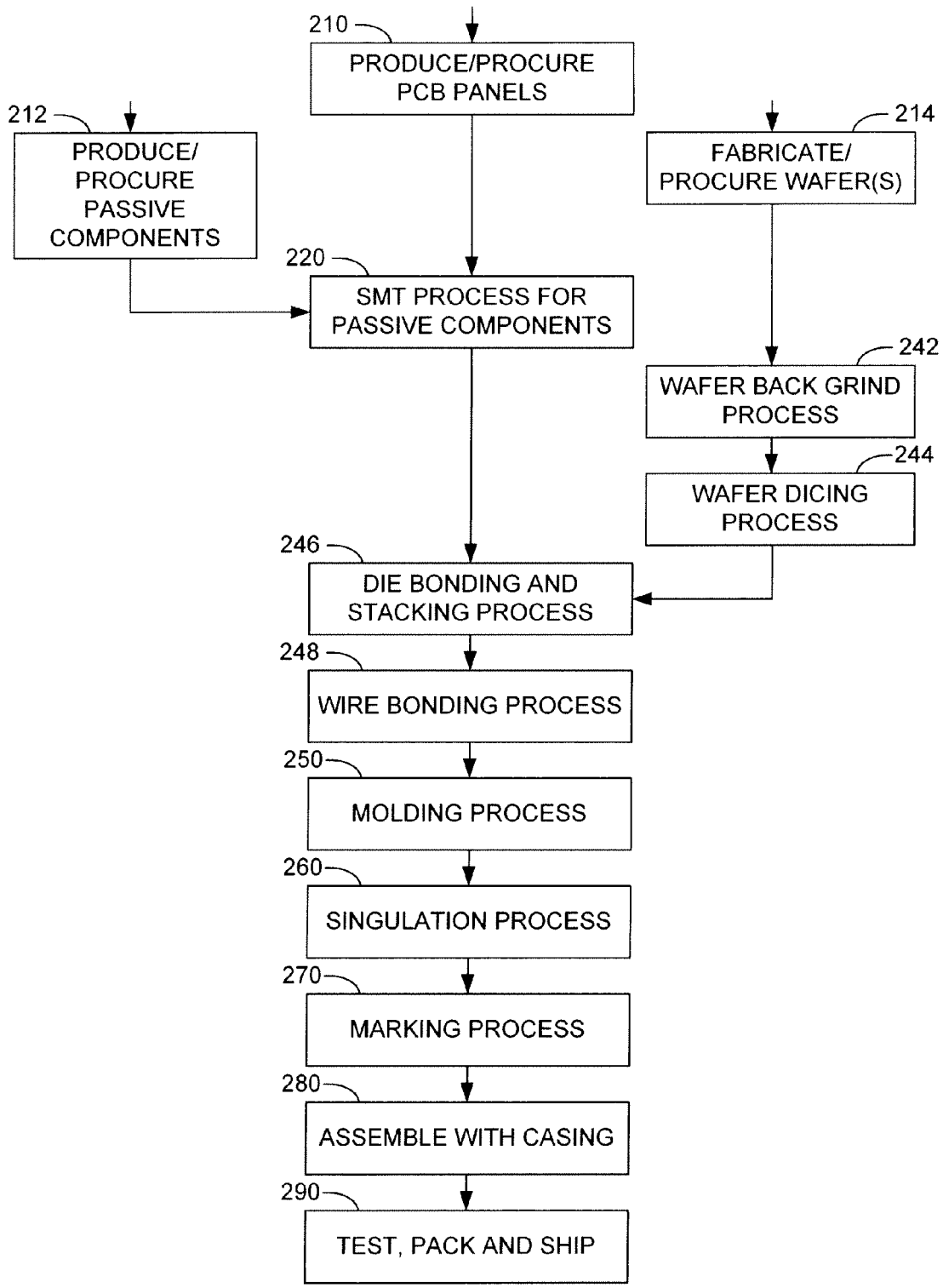
FIG. 3 is a flow diagram showing a method for producing the MMC core unit of FIG. 1(A) according to another embodiment of the present invention.

The present invention relates to an improvement in MMC/SD flash memory devices. The following description is presented to enable one of ordinary skill in the art to make and use the invention as provided in the context of a particular application and its requirements. As used herein, the terms "upper", "upwards", "lower", and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

FIGS. 1(A) and 1(B) are perspective views respectively showing a Multi-Media Card (MMC) core unit 100 and a Secure Digital (SD) core unit 100A according to alternative embodiments of the present invention. MMC core unit 100 generally includes a printed circuit board assembly (PCBA) 110 and a plastic housing 150 that is molded onto PCBA 110. Referring to the upper portion of FIG. 1(A), PCBA 110 includes a printed circuit board (PCB) 111 including a rear PCB section 112 at a rear end of PCB 111, and a front (plug) section 114 at a front end of PCB 111. PCB 111 is a substantially flat substrate, and has opposing sides that are referred to below as upper (first) surface 116 and lower (second) surface 118. Formed on upper surface 116 in plug section 114 are seven of metal contacts 120. Metal contacts 120 are shaped and arranged in a pattern established by the MMC specification. PCB 111 is formed in accordance with known PCB manufacturing techniques such that metal contacts 120, IC dies 130 and 135, and passive components 142 and 144 are electrically interconnected by a predefined network including conductive traces 131 and 136 and other conducting structures that are sandwiched between multiple layers of an insulating material (e.g., FR4) and adhesive. Referring to FIG. 1(B), SD core unit 100A has a structure similar to that of MMC core unit 100, with differences that are set by SD standards and known to those skilled in the art. Thus, with the exceptions noted below, the following description of MMC core unit 100 is applicable to SD core unit 100A.

According to an aspect of the invention, passive components are mounted onto lower surface 118 of PCB 111 using one or more standard surface mount technology (SMT) techniques, and one or more integrated circuit (IC) die (e.g., control IC die 130 and flash memory die 135) are mounted using chip-on-board (COB) techniques. As indicated in FIG. 2, during the SMT process, the passive components, such as capacitors 142 and oscillator 144 are mounted onto contact pads (described below) disposed on lower surface 118, and are then secured to the contact pads using known solder reflow techniques. To facilitate the SMT process, each of the passive components is packaged in any of the multiple known (preferably lead-free) SMT packages (e.g., ball grid array (BGA) or thin small outline package (TSOP)). In contrast, IC dies 130 and 135 are unpackaged, semiconductor "chips" that are mounted onto surface 118 and electrically connected to corresponding contact pads using known COB techniques. For example, as indicated in FIG. 2, control IC die 130 is electrically connected to PCB 111 by way of wire bonds 160-1 that are formed using known techniques. Similarly, flash memory IC die 135 is electrically connected to PCB 111 by way of wire bonds 160-2. Passive components 142, 144, IC dies 130 and 135, and metal contacts 120 are operably interconnected by way of metal traces 131 and 136 that are formed on and in PCB 111 using known techniques, a few of which being depicted in FIG. 1(A) in a simplified manner by short dashed lines.

Housing 150 comprises molded plastic arranged such that substantially all of the plastic used to form housing 150 is located below (i.e., on one side of) PCB 111. Housing 150 includes a peripheral surface 151 extending downward (i.e., perpendicular to PCB 111), and a lower surface 152 that extends parallel to PCB 111. For discussion purposes, the portion of peripheral surface 151 surrounding rear section 112 of PCB 111 is referred to below as rear surface section 151-1, and the section of peripheral surface 151 surrounding front section 114 of PCB 111 is referred to below as front surface section 151-2. Similarly, the portion of lower surface 152 covering rear section 112 of PCB 111 is referred to below as rear surface section 152-1, and the section of lower surface 152 covering front section 114 of PCB 111 is referred to below as front cover section 152-2.

Referring again to FIG. 1(A), a rear structure 102 of MMC device 100 is defined by rear surface section 151-1, rear surface section 152-1, and the exposed upper surface 116 of rear PCB section 112. Similarly, a front (plug) structure 105 of MMC device 100 is defined by front surface section 151-2, front surface section 152-2, and the exposed upper surface 116 of front section 114.

As indicated in FIG. 2, according to an embodiment of the present invention, housing 150 includes a planar surface 152 that is parallel to PCB 111, and defines a single plane such that a first thickness T1 of front structure 105 (i.e., measured between upper PCB surface 116 and planar surface 152 adjacent to metal contacts 120) is substantially equal to a second thickness T2 of rear section 102 (i.e., measured between upper PCB surface 116 and planar surface 152 adjacent to IC 135). That is, as indicated in FIG. 2, MMC core unit 100 is substantially flat along its entire length (i.e., from rear edge 151-1A to front edge 151-1B). The term "substantially flat" is meant to indicate that planar surface 152 is substantially parallel to an uppermost surface of MMC core unit 100 along its entire length. In the embodiment shown in FIG. 1(A), the uppermost surface of MMC core unit 100 is defined in part by upper surface 116 of PCB 111, which is parallel to planar surface 152 along the entire length of MMC core unit 100. Similarly, the term "substantially flat" is also intended to cover embodiments described below in which the housing includes a thin wall structure that is formed on or otherwise contacts the upper surface of the PCB. In these embodiments, the thickness T2 of rear structure 102 may differ by a small amount (e.g., 5% from thickness T1 of front structure 105).

According to an aspect of the present invention, the "flatness" (i.e., thinness measured in the direction of thicknesses T1 and T2, see FIG. 2) associated with MMC core unit 100 is achieved by mounting all of the IC dies ("chips") and other electronic components of MMC core unit 100 on lower surface 118 of PCB 111 (i.e., on the side opposite to metal contacts 120). That is, the minimum overall thickness of MMC core unit 100 is determined by the thickness T1, which is required to maintain a snug connection between front structure 105 and a female MMC socket (not shown). Because this arrangement requires that metal contacts 120 be located at the uppermost surface, and that plug wall section 151-2 plug and cover section 152-2 extend a predetermined distance below PCB 111 to provide the required thickness T1. Thus, the overall thickness of MMC core unit 100 can be minimized by mounting the IC dies 130 and 135 and passive components (e.g., capacitor 142) only on lower surface 118 of PCB 111. That is, if the IC dies and passive components are mounted on upper surface 116, then the overall thickness of the resulting MMC structure would be the required thickness T1 plus the thickness that the ICs extend above PCB 111 (plus the thickness of a protective wall, if used).

According to another aspect associated with the embodiment shown in FIG. 1(A) and 1(B), upper surface 116 of PCB 111 is entirely exposed on the upper surface of MMC core unit 100, thus facilitating the production of MMC core unit 100 with a maximum thickness equal to thickness T1 of front structure 105. That is, because metal contacts 120 are formed on upper surface 116, and upper surface 116 defines the higher end of required plug structure thickness T1, the overall height of MMC core unit 100 can be minimized by exposing upper surface 116 (i.e., by making any point on upper PCB surface 116 the uppermost point of MMC core unit 100). As indicated in FIG. 1(A), in accordance with feature specifically associated with MMC core unit 100, peripheral wall 151 extends around and covers the peripheral side edges of PCB 111, and an upper edge of peripheral wall 151 is coplanar with upper surface 116 of PCB 111. By covering the peripheral side edge of PCB 111, peripheral wall 151 prevents objects from wedging between PCB 111 and housing 150, thereby preventing undesirable separation of PCBA 110 from housing 150.

FIG. 3 is a flow diagram showing a method for producing MMC core unit 100 (or SD core unit 100A) according to another embodiment of the present invention. Summarizing the novel method, a PCB panel is generated using known techniques (block 210), passive components are mounted on the PCB panel using SMT techniques (block 220), and the IC dies are die bonded (block 246) and wire bonded (block 248) using known COB techniques. Molten plastic is then used to form a molded housing over the passive components and the IC dies (block 250). Then PCB panel is then singulated (cut) in to separate MMC/SD core units (block 260), the individual MMC/SD core units are marked (block 270), the marked MMC/SD core units are assembled into appropriate cases to form final MMC/SD devices (block 280), and then the MMC/SD devices are tested, packed and shipped (block 290) according to customary practices. The advantages of this method over conventional MMC/SD manufacturing methods are set forth below in conjunction with the detailed description of the method.

The flow diagram of FIG. 3 will now be described in additional detail below with reference to FIGS. 4(A) to 22.

Referring to the upper portion of FIG. 3, the manufacturing method begins with filling a bill of materials including producing/procuring PCB panels (block 210), producing/procuring passive (discrete) components (block 212) such as resistors, capacitors, diodes and oscillators that are packaged for SMT processing, and producing/procuring a supply of IC wafers (or individual IC dies).

Figure 4A:
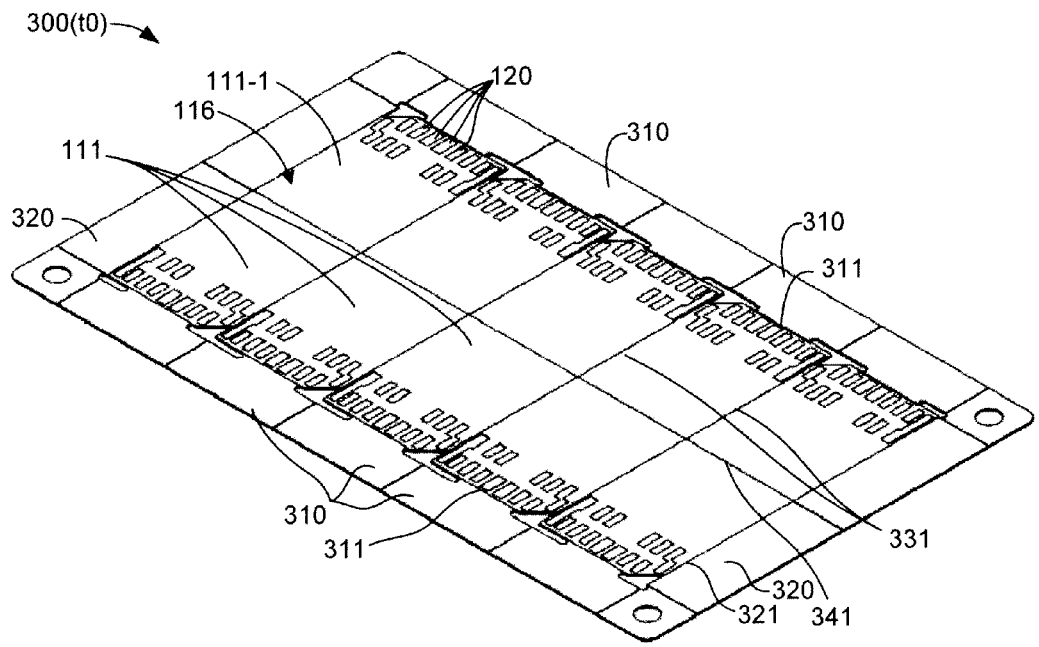
FIGS. 4(A) and 4(B) are bottom and top perspective views showing a PCB panel utilized in the method of FIG. 3.
Figure 4B:
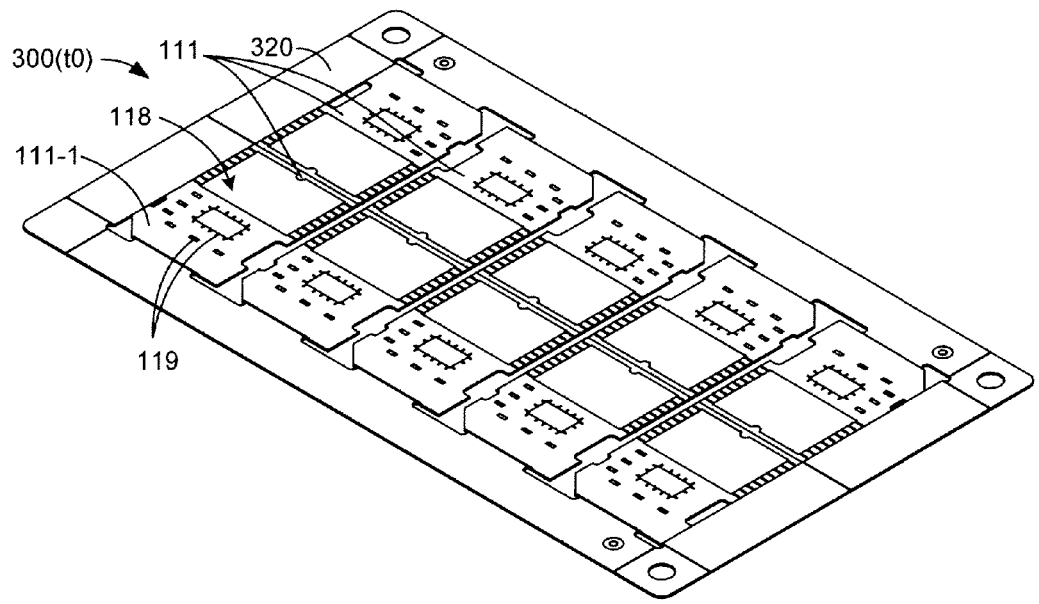

FIGS. 4(A) and 4(B) are top and bottom perspective views, respectively, showing a PCB panel 300(t0) provided in block 210 of FIG. 3 according to a specific embodiment of the present invention. The suffix "tx" is utilized herein to designated the state of the PCB panel during the manufacturing process, with "t0" designating an initial state. Sequentially higher numbered prefixes (e.g., "t1", "t2" and "t3") indicate that PCB panel 300 has undergone additional processing.

As indicated in FIG. 4(A) and 4(B), PCB panel 300(t0) includes a two-by-five matrix of regions designated as PCBs 111, each having the features described above with reference to FIGS. 1(A) and 2. FIG. 4(A) shows upper surface 116 of each PCB 111 (e.g., upper surface 116 of panel 111-1 includes metal contacts 120), and FIG. 4(B) shows lower surface 118 of each PCB 111. Note that lower surface 118 of each PCB 111 (e.g., PCB 111-1) includes multiple contact pads 119 arranged in predetermined patterns for facilitating SMT and COB processes, as described below.

As indicated in FIG. 4(A), in addition to the two rows of PCBs 111, panel 300(t0) includes end border regions 310 and side border regions 320 that surround the PCBs 111. Designated cut lines are scored or otherwise partially cut into PCB panel 300(t0) along the borders of each of these regions and between the two rows of PCBS, but do not pass through the panel material. For example, end cut lines 311 separate end border panels 310 from associated PCBs 111, side cut lines 321 separate side border panels 310 from associated PCBs 111, and central cut lines 341 separates the two rows of PCBs 111. PCB cut lines 331 are formed along the side edges between adjacent PCBs 111. The border panels are provided with positioning holes and other features known to those skilled in the art to facilitate the manufacturing process, and are removed during singulation (described below).

Figure 5:
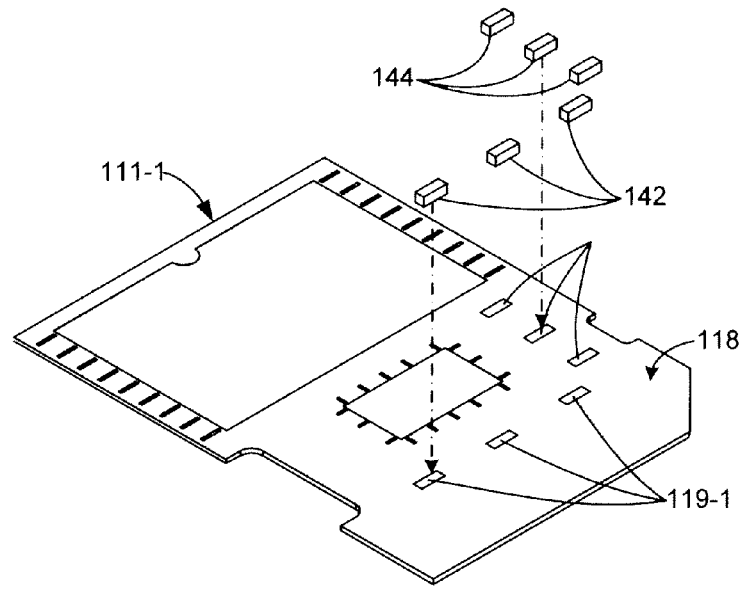
FIG. 5 is a perspective view depicting a surface mount technology (SMT) process for mounting passive components on a PCB according to the method of FIG. 3.
Figure 6:
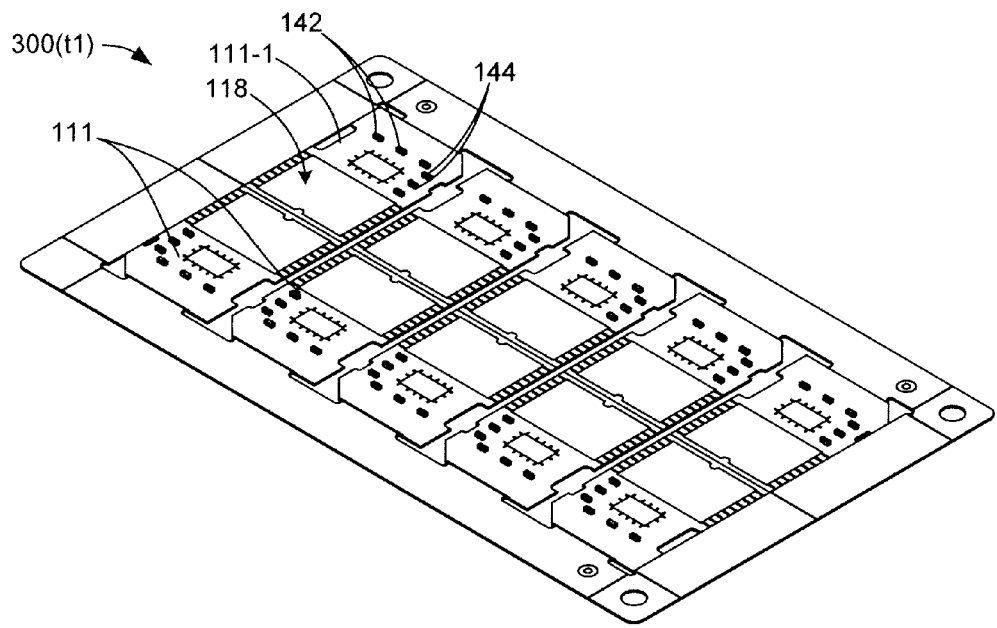
FIG. 6 is a top perspective views showing the PCB panel of FIG. 4(B) after the SMT process is completed.

FIG. 5 is a perspective view depicting a portion of a SMT process that is used to mount passive components on PCB 111-1 according to block 220 of FIG. 3. During the first stage of the SMT process, lead-free solder paste is printed on contact pads 119-1 and 119-2, which in the present example correspond to SMT components 142 and 144, using custom made stencil that is tailored to the design and layout of PCB 111-1. After dispensing the solder paste, the panel is conveyed to a conventional pick-and-place machine that mounts SMT components 142 and 144 onto contact pads 119-1 and 119-2, respectively, according to known techniques. Upon completion of the pick-and-place component mounting process, the PCB panel is then passed through an IR-reflow oven set at the correct temperature profile. The solder of each pad on the PC board is fully melted during the peak temperature zone of the oven, and this melted solder connects all pins of the passive components to the finger pads of the PC board. FIG. 6 shows the resulting sub-assembled PCB panel 300(t1), in which each PCB 111 (e.g., PCB 111-1) includes passive components 142 and 144 mounted thereon by the completed SMT process.

Figure 7:
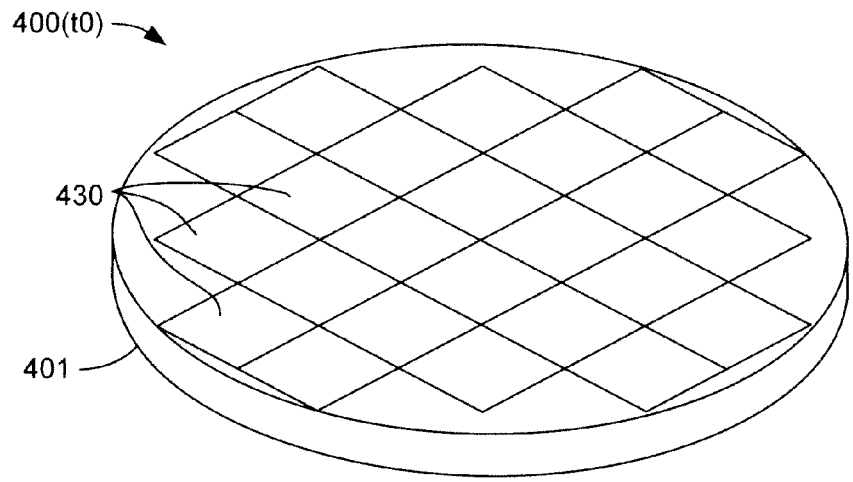
FIG. 7 is a simplified perspective view showing a semiconductor wafer including integrated circuits (ICs) utilized in the method of FIG. 3.

FIG. 7 is a simplified perspective view showing a semiconductor wafer 400(t0) procured or fabricated according to block 214 of FIG. 3. Wafer 400(t0) includes multiple ICs 430 that are formed in accordance with known photolithographic fabrication (e.g., CMOS) techniques on a semiconductor base 401. In the example described below, wafer 400(t1) includes ICs 430 that comprise MMC/SD controller circuits. In a related procedure, a wafer (not shown) similar to wafer 400(t1) is produced/procured that includes flash memory circuits, and in an alternative embodiment (described in additional detail below), ICs 430 may include both MMC/SD controller circuits and flash memory circuits. In each instance, these wafers are processed as described herein with reference to FIGS. 8(A), 8(B) and 8(C).

Figure 8A:
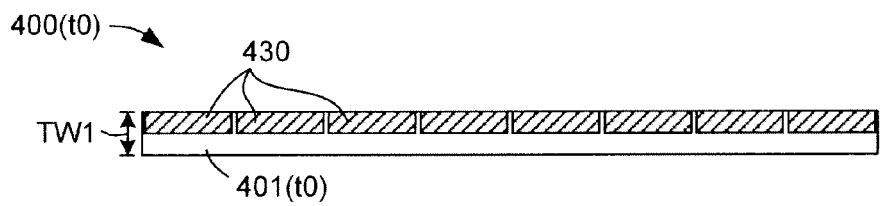
FIGS. 8(A), 8(B) and 8(C) are simplified cross-sectional side views depicting a process of grinding and dicing the wafer of FIG. 7 to produce IC dies.
Figure 8B:
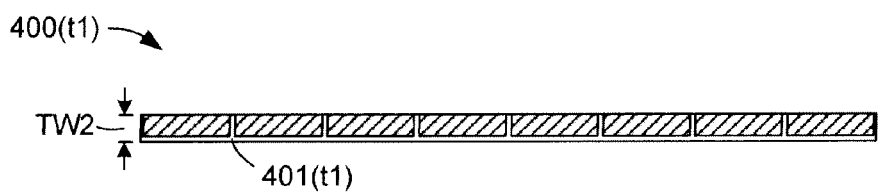

As indicated in FIGS. 8(A) and 8(B), during a wafer back grind process according to block 242 of FIG. 3, base 401 is subjected to a grinding process in order to reduce the overall initial thickness TW1 of each IC 430. Wafer 400(t1) is first mount face down on sticky tape (i.e., such that base layer 401(t0) faces away from the tape), which is pre-taped on a metal or plastic ring frame (not shown). The ring-frame/wafer assembly is then loaded onto a vacuum chuck (not shown) having a very level, flat surface, and has diameter larger than that of wafer 400(t0). The base layer is then subjected to grinding until, as indicated in FIG. 8(B), wafer 400(t1) has a pre-programmed thickness TW2 that is less than initial thickness TW1 (shown in FIG. 8(A)). The wafer is cleaned using de-ionized (DI) water during the process, and wafer 400(t1) is subjected to a flush clean with more DI water at the end of mechanical grinding process, followed by spinning at high speed to air dry wafer 400(t1).

Figure 8C:
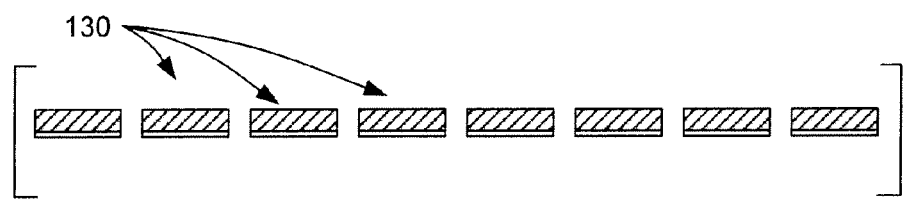

Next, as shown in FIG. 8(C), the wafer is diced (cut apart) along predefined border regions separating ICs 430 in order to produce IC dies 130 according to block 244 of FIG. 3. After the back grind process has completed, the sticky tape at the front side of wafer 400(t1) is removed, and wafer 400(t1) is mounted onto another ring frame having sticky tape provided thereon, this time with the backside of the newly grinded wafer contacting the tape. The ring framed wafers are then loaded into a die saw machine. The die saw machine is pre-programmed with the correct die size information, X-axis and Y-axis scribe lanes' width, wafer thickness and intended over cut depth. A proper saw blade width is then selected based on the widths of the XY scribe lanes. The cutting process begins dicing the first lane of the X-axis of the wafer. De-ionized wafer is flushing at the proper angle and pressure around the blade and wafer contact point to wash and sweep away the silicon saw dust while the saw is spinning and moving along the scribe lane. The sawing process will index to the second lane according to the die size and scribe width distance. After all the X-axis lanes have been completed sawing, the wafer chuck with rotate 90 degree to align the Y-axis scribe lanes to be cut. The cutting motion repeated until all the scribe lanes on the Y-axis have been completed. By implementing this wafer process, the die height (i.e., thickness TW2, see FIG. 8(B)) of IC dies 130 is greatly reduced over conventional packaged controller devices, thereby facilitating stacked memory arrangements such as those described below with reference to FIG. 18 that greatly increase memory capacity of the MMC/SD devices without increasing the device footprint.

Figure 9:
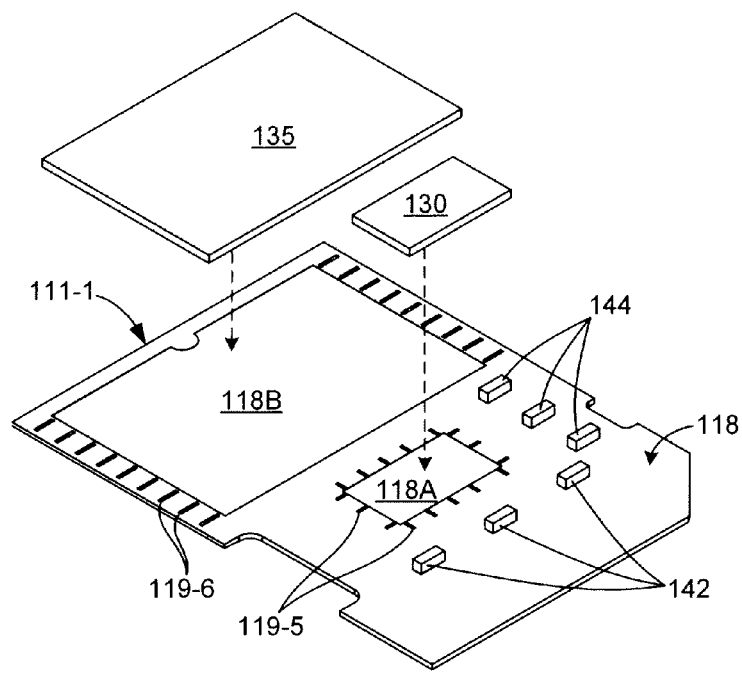
FIG. 9 is a perspective view depicting a die bonding process utilized to mount the IC dies of FIG. 8(C) on a PCB according to the method of FIG. 3.
Figure 10:
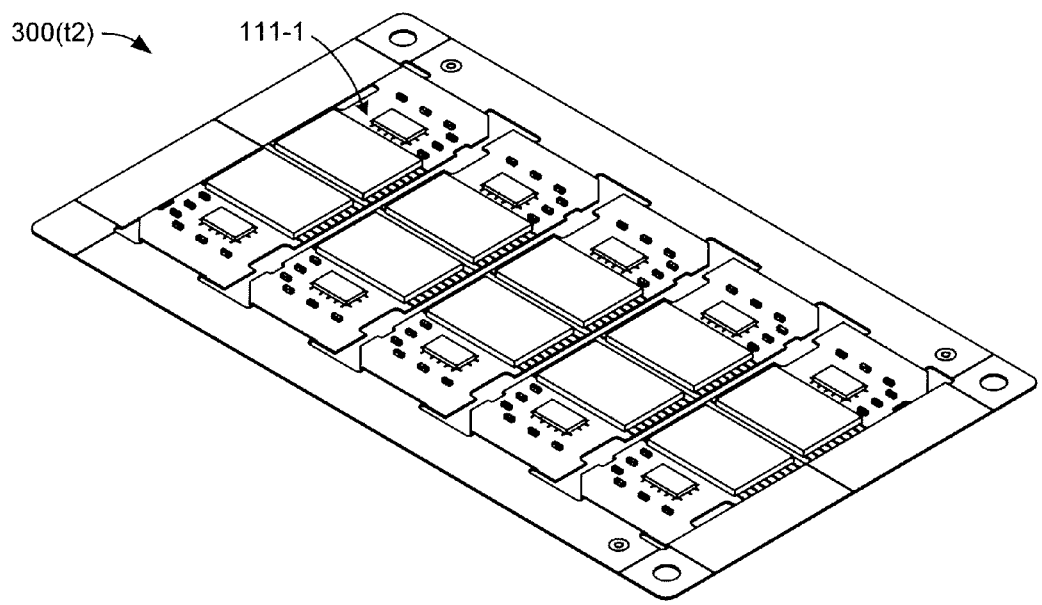
FIG. 10 is a top perspective views showing the PCB panel of FIG. 4(B) after the die bonding process is completed.

FIG. 9 is a perspective view depicting a die bonding process utilized to mount the controller IC dies 130 of FIG. 8(C) and flash memory IC dies 135 on PCB 111-1 of the PCB panel according to block 246 of FIG. 3. The die bonding process is performed on PCB panel 300(t1) (see FIG. 6), that is, after completion of the SMT process. The die bonding process generally involves mounting controller IC dies 130 into lower surface region 118A, which is surrounded by contact pads 119-5, and mounting flash IC dies 135 into lower surface region 118B, which is disposed between rows of contact pads 119-6. In one specific embodiment, an operator loads IC dies 130 and 135 onto a die bonder machine according to known techniques. The operator also loads multiple PCB panels 300(t1) onto the magazine rack of the die bonder machine. The die bonder machine picks the first PCB panel 300(t1) from the bottom stack of the magazine and transports the selected PCB panel from the conveyor track to the die bond (DB) epoxy dispensing target area. The magazine lowers a notch automatically to get ready for the machine to pick up the second piece (the new bottom piece) in the next cycle of die bond operation. At the die bond epoxy dispensing target area, the machine automatically dispenses DB epoxy, using pre-programmed write pattern and speed with the correct nozzle size, onto the target areas 118A and 118B of each of the PCB 111 of PCB panel 300(t1). When all PCBs 111 have completed this epoxy dispensing process, the PCB panel is conveyed to a die bond (DB) target area. Meanwhile, at the input stage, the magazine is loading a second PCB panel to this vacant DB epoxy dispensing target area. At the die bond target area, the pick up arm mechanism and collet (suction head with rectangular ring at the perimeter so that vacuum from the center can create a suction force) picks up an IC die 130 and bonds it onto area 118A, where epoxy has already dispensed for the bonding purpose, and this process is then performed to place IC die 135 into region 118B. Once all the PCB boards 111 on the PCB panel have completed die bonding process, the PCB panel is then conveyed to a snap cure region, where the PCB panel passes through a chamber having a heating element that radiates heat having a temperature that is suitable to thermally cure the epoxy. After curing, the PCB panel is conveyed into the empty slot of the magazine waiting at the output rack of the die bonding machine. The magazine moves up one slot after receiving a new panel to get ready for accepting the next panel in the second cycle of process. The die bonding machine will repeat these steps until all of the PCB panels in the input magazine are processed. This process step may repeat again for the same panel for stack die products that may require to stacks more than one layer of memory die. FIG. 10 is a top perspective views showing PCB panel 300(t2) after the die bonding process is completed.

Figure 11:
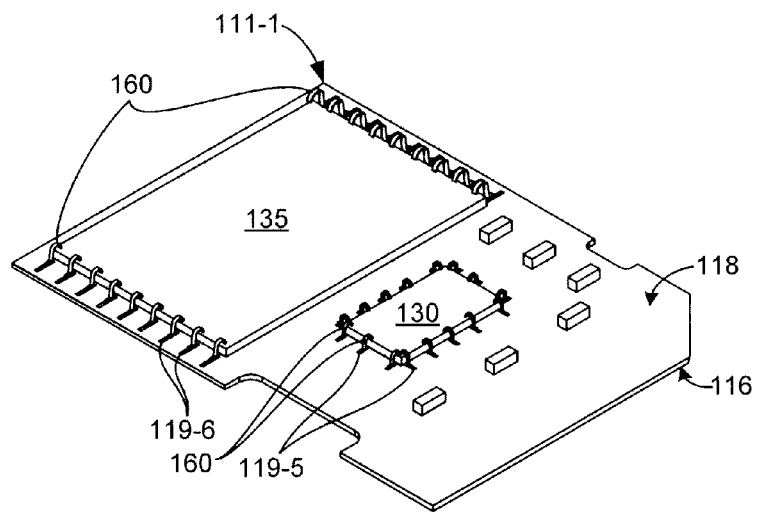
FIG. 11 is a perspective view depicting a wire bonding process utilized to connect the IC dies of FIG. 8(C) to corresponding contact pads disposed on a PCB according to the method of FIG. 3.
Figure 12:
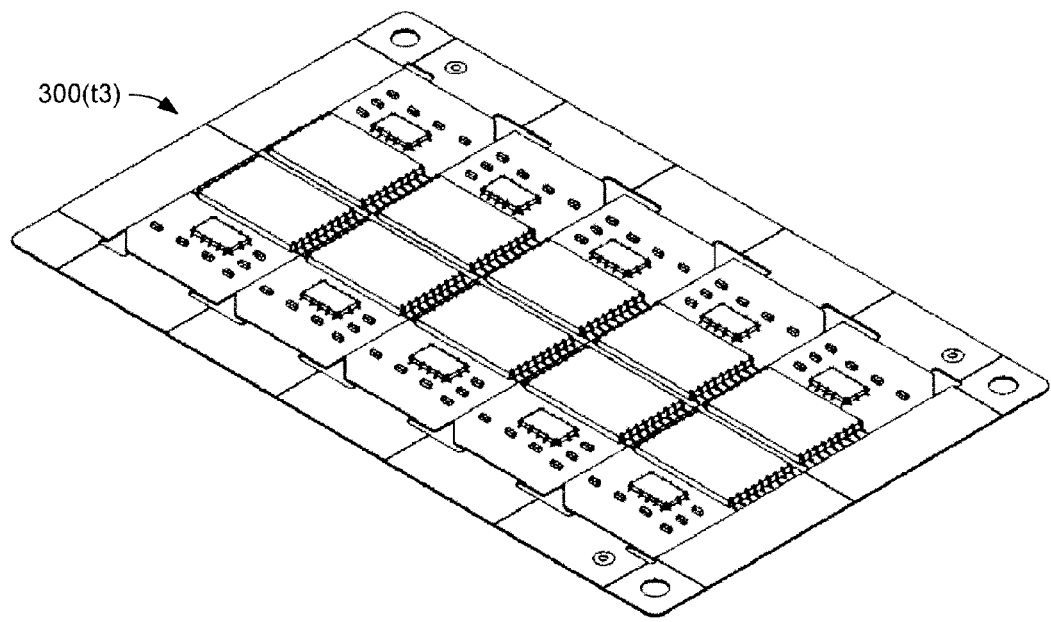
FIG. 12 is a top perspective views showing the PCB panel of FIG. 4(B) after the wire bonding process is completed.

FIG. 11 is a perspective view depicting a wire bonding process utilized to connect the IC dies 130 and 135 to corresponding contact pads 119-5 and 119-6, respectively, according to block 248 of FIG. 3. The wire bonding process proceeds as follows. Once a full magazine of PCB panels 300(t2) (see FIG. 10) has completed the die bonding operation, an operator transports the PCB panels 300(t2) to a nearby wire bonder (WB) machine, and loads the PCB panels 300(t2) onto the magazine input rack of the WB machine. The WB machine is pre-prepared with the correct program to process this specific MMC/SD device. The coordinates of all the ICs' pads 119-5 and 119-6 and PCB gold fingers were previously determined and programmed on the WB machine. After the PCB panel with the attached dies is loaded at the WB bonding area, the operator commands the WB machine to use optical vision to recognize the location of the first wire bond pin of the first memory die of the first PCB on the panel. The WB machine then connects a wire bond 160 between each corresponding wire bond pin and contact pad pair. Once the first pin is set correctly, the WB machine can carry out the whole wire bonding process for the rest of the panels of the same product type automatically. For multiple flash layer stack dies, the PCB panels may be returned to the WB machine to repeat wire bonding process for the second stack. FIG. 12 is a top perspective views showing PCB panel 300(t3) after the wire bonding process is completed.

By utilizing the COB techniques described above with reference to FIGS. 9-12 to mount controller IC 130 and flash memory IC 135, the PCB area typically taken up by SMT-packaged controllers and flash devices is dramatically reduced, along with the interconnection lengths and resistance, thereby facilitating the use of larger (i.e., greater capacity) flash memory chips and better device performance. Further, in comparison to the standard MMC/SD device manufacturing that uses SMT process, the combined COB and SMT processes described above with reference to FIGS. 5-12 is less expensive in that, in the SMT-only manufacturing process, the bill of materials such as flash memory and the controller chip are also manufactured by COB process, so all the COB costs are already factored into the packaged memory chip and controller chip.

Figure 13A:
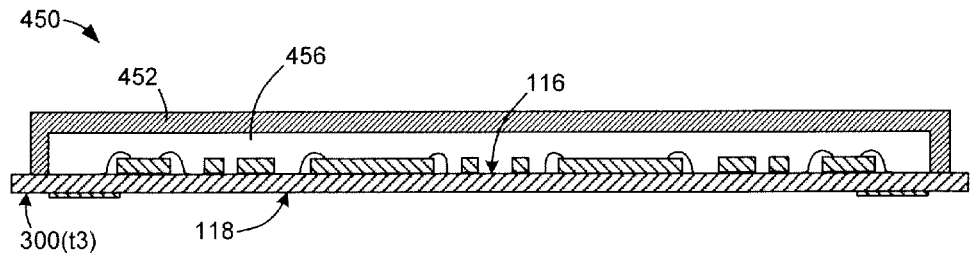
FIGS. 13(A) and 13(B) are simplified cross-sectional side views depicting a molding process for forming a molded housing over the PCB panel of FIG. 4(B) according to the method of FIG. 3.
Figure 13B:
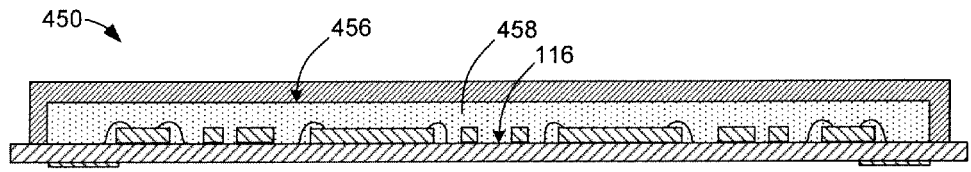
Figure 14:
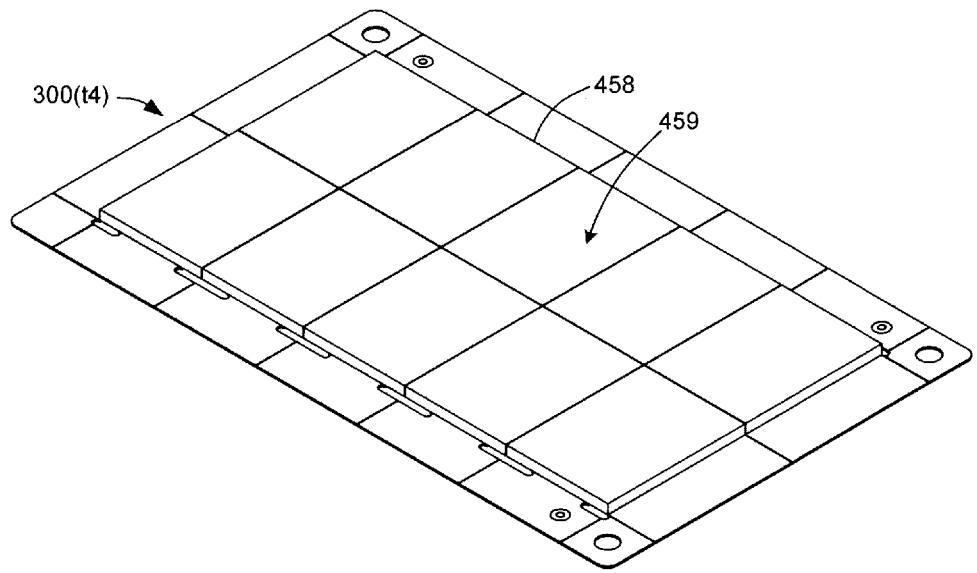
FIG. 14 is a top perspective views showing the PCB panel of FIG. 4(B) after the molding process is completed.

FIGS. 13(A) and 13(B) are simplified cross-sectional side views depicting a molding process for forming a molded housing layer over PCB panel 300(t3) according to block 250 of FIG. 3. As indicated in FIG. 13(A), after the wire bonding process is completed, SD panel 300(t3) is loaded into a mold machine 450 including a cover plate 452 that mounts onto lower surface 116 of PCB panel 300(t3), and defines a chamber 456 that is disposed over the IC chips, wire bonds and passive components that are mounted on lower surface 116. Note that no molding material is applied to upper surface 118. Transfer molding is prefer here due to the high accuracy of transfer molding tooling and low cycle time. The molding material in the form of pellet is preheated and loaded into a pot or chamber (not shown). As depicted in FIG. 13(B), a plunger (not shown) is then used to force the material from the pot through channels known as a spruce and runner system into the mold cavity 456, causing the molten (e.g., plastic) material to form a molding layer 458 that encapsulates all the IC chips and components, and to cover all the exposed areas of lower surface 116. The mold remains closed as the material is inserted and filled up all vacant in cavity 456. During the process, the walls of cover plate 452 are heated to a temperature above the melting point of the mold material, which facilitates a faster flow of material through cavity 456. Mold machine 450 remains closed until a curing reaction within the molding material is complete. A cooling down cycle follows the injection process, and the molding materials of molding layer 458 start to solidify and harden. Ejector pins push PCB panel 300(t4) (shown in FIG. 14) from the mold machine once molding layer 458 has hardened sufficiently. As depicted in FIG. 14, molding layer 458 forms a uniform block with a flat, smooth upper surface 459 on PCB panel 300(t4). By forming molding layer (i.e., housing material) 458 directly over the electronic components, the housing material can be formed very thin over "tall" structured (e.g., IC dies 130 and 135), thus reducing plastic packaging space requirements that are needed with pre-molded plastic housing that are mounted over the IC structures.

Figure 15:
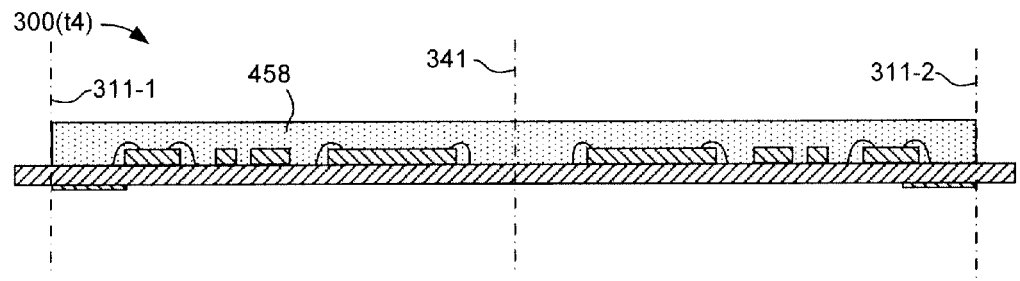
FIG. 15 is simplified cross-sectional side view depicting a singulation process for separating the PCB panel of FIG. 4(B) into individual MMC core units according to the method of FIG. 3.

FIG. 15 is simplified cross-sectional side view depicting a singulation process according to block 260 of FIG. 3 that is used to separate PCB panel 300(t4) into individual MMC/SD devices. PCB panel 300(t4) is loaded into a saw machine (not shown) that is pre-programmed with a singulation routine that includes predetermined cut locations. The saw blade is aligned to the first cut line (e.g., end cut line 311-1) as a starting point by the operator. The coordinates of the first position are stored in the memory of the saw machine. The saw machine then automatically proceeds to cut up (singulate) PCB panel 300(t4), for example, successively along cut lines 311-1, 341, and 311-2, and then along the side cut lines and PCB cut lines (see FIG. 4(A)) to form individual MMC/SD core units according to the pre-programmed singulation routine.

Figure 16A:
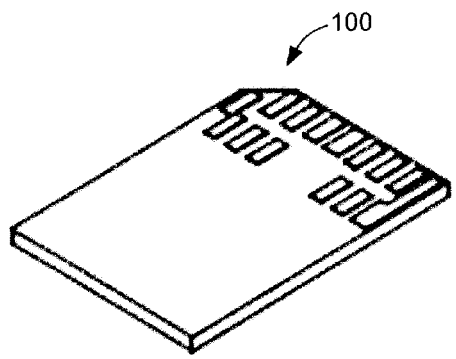
FIGS. 16(A) and 16(B) are bottom and top perspective views showing MMC core units after the singulation process of FIG. 3 is completed.
Figure 16B:
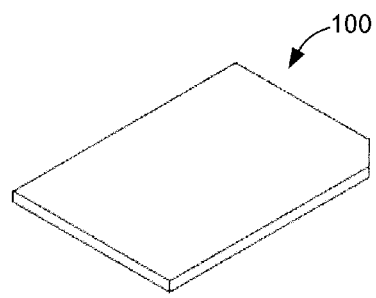

FIGS. 16(A) and 16(B) are top and bottom perspective views showing an MMC core units 100 after the singulation process is completed. Note that the molded housing provides greater moisture and water resistance and higher impact force resistance than that achieved using conventional manufacturing methods in which the housing is mounted over the PCB. Further, the combined COB, SMT and plastic molding method according to the present invention provides a less expensive and higher quality (i.e., more reliable) memory product than that possible using conventional SMT-only manufacturing methods.

Figure 17A:
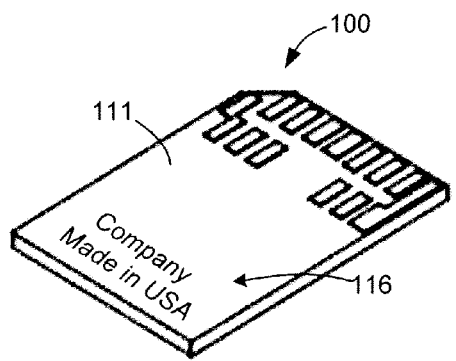
FIGS. 17(A) and 17(B) are bottom and top perspective views showing the MMC core unit of FIG. 16(A) after a marking process is performed in accordance with the method of FIG. 3.
Figure 17B:
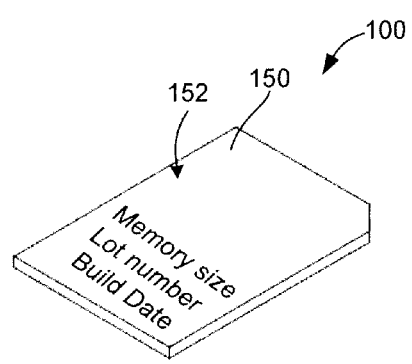

FIGS. 17(A) and 17(B) are top and bottom perspective views showing a singulated MMC core unit 100 after a marking process is performed in accordance with block 270 of the method of FIG. 3. The singulated and completed MMC core units 100 undergo a marking process in which a designated company's name, memory size, lot number, or other related information are printed on surface 152 of housing 150 and/or upper surface 116 of PCB 111. After marking, MMC core units 100 are placed in the baking oven to cure the permanent ink.

Figure 18:
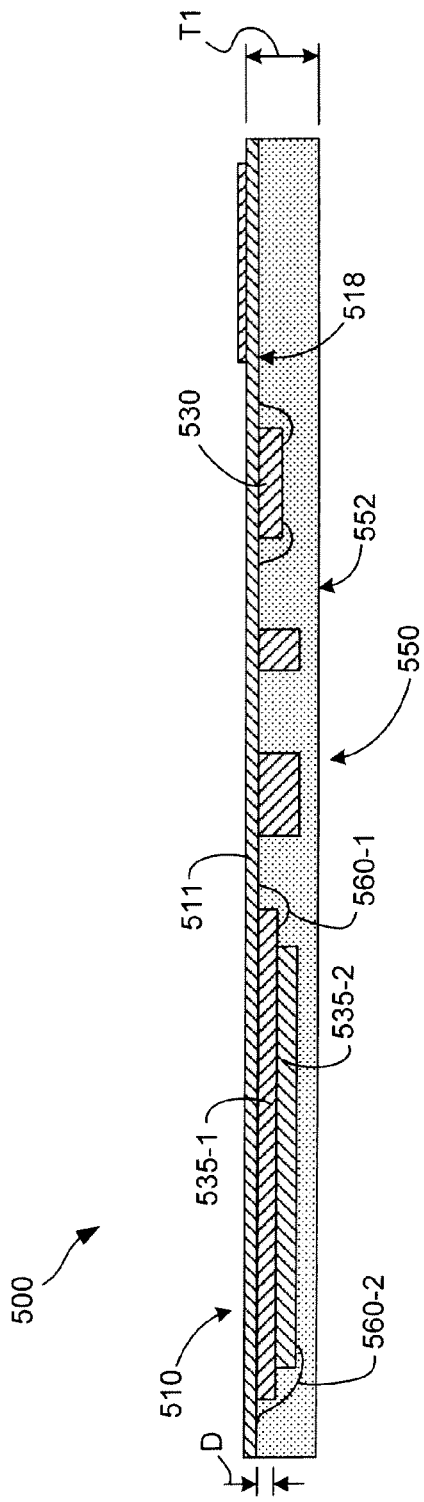
FIG. 18 is simplified cross-sectional side view showing an MMC/SD core unit including stacked-memory according to another embodiment of the present invention.

As suggested in the above example, in addition to reducing overall manufacturing costs by utilizing unpackaged controller and flash memory dies (i.e., by eliminating the packaging costs associated with SMT-ready controller and flash memory devices), the present invention provides a further benefit of facilitating greatly expanded memory capacity without increasing the overall size of a MMC/SD device. For example, FIG. 18 is simplified cross-sectional side view showing a stacked-memory MMM/SD core unit 500 in which a first flash memory chip 535-1 is mounted on a lower surface 518 and connected by first wire bonds 560-1 to PCB 511 in the manner described above. Because the IC die height (thickness) D is much smaller than packaged flash memory devices, and because the thickness T1 of MMC/SD core unit 500 is set to assure a snug fit in a conventional female MMC/SD socket connector (not shown), the present invention facilitates a stacked memory arrangement in which a second flash memory die 535-2 is mounted on first flash memory die 535-1 and connected to PCB 511 by way of second wire bonds 560-2. In an alternative embodiment (not shown), second flash memory die 535-2 may be connected to contacts provided on first flash memory die 535-1 by associated wire bonds. This stacked memory arrangement greatly increases memory capacity of the SD devices without increasing the footprint (i.e., thickness T1, length and width) of MMC/SD core unit 500.

Figure 19:
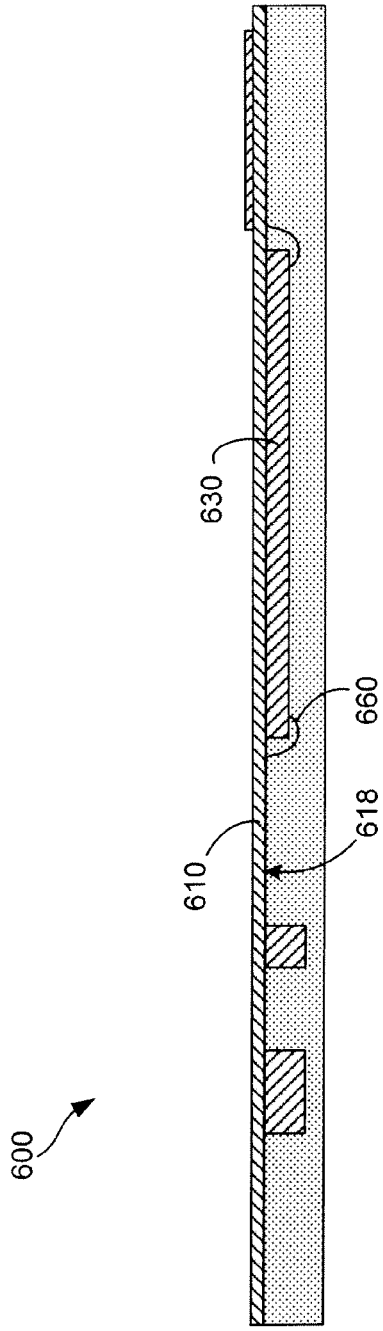
FIG. 19 is simplified cross-sectional side view showing a single-chip MMC/SD core unit according to another embodiment of the present invention.
Figure 20:
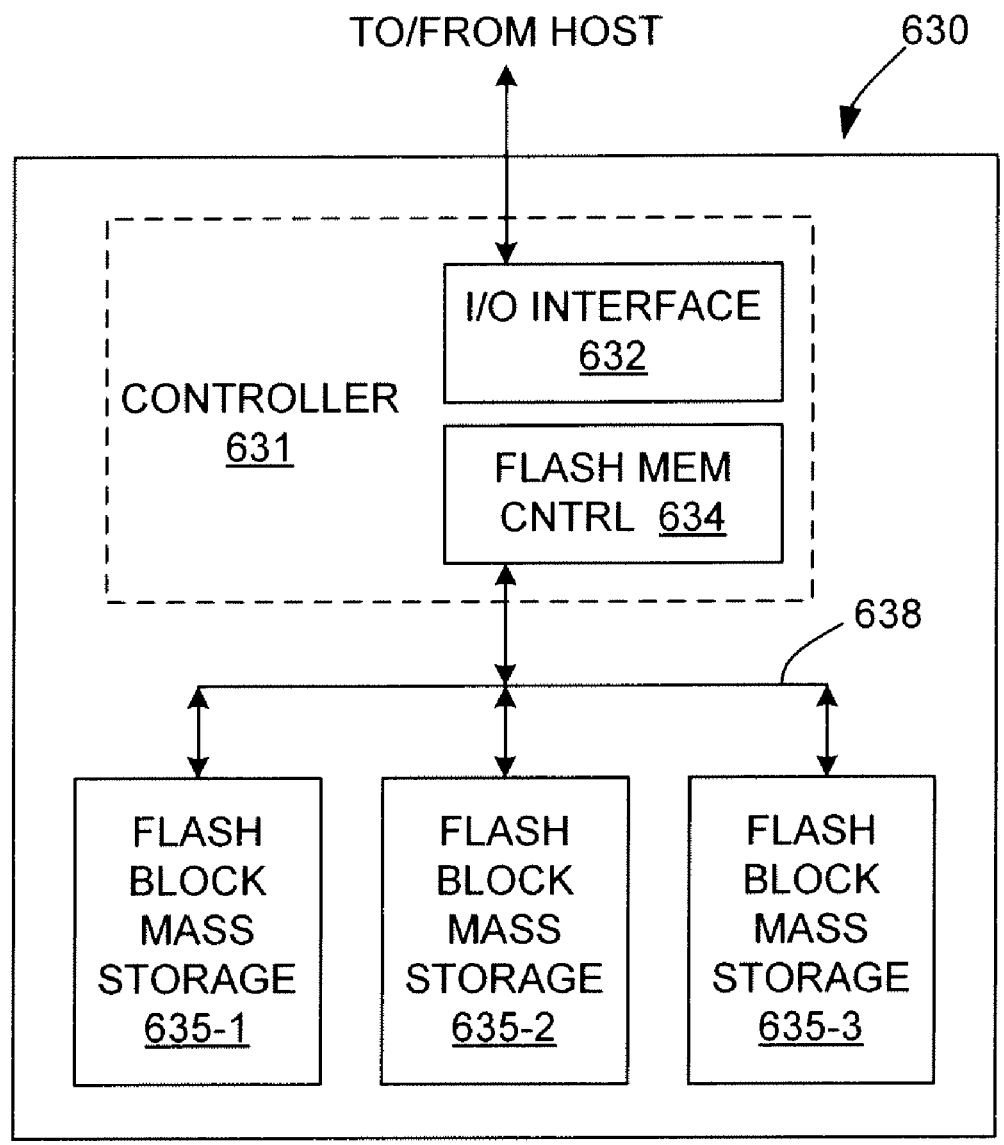
FIG. 20 is a block diagram showing a flash microcontroller integrated circuit die with flash mass storage blocks that is utilized in the single-chip MMC/SD core unit of FIG. 19.

FIG. 19 is simplified cross-sectional side view showing a MMC/SD core unit 600 including stacked-memory according to another embodiment of the present invention. MMC/SD core unit 600 is distinguished over the previous embodiments in that, instead of separate MMC/SD controller and flash memory chips, MMC/SD core unit 600 utilizes a single-chip controller/flash die 630 that is connected to a PCB 611 by way of wire bonds 660 in the manner described above, and is characterized in that, as shown in FIG. 20, single-chip controller/flash die 630 includes both a controller circuit 631 and one or more flash block mass storage circuits 635-1 to 635-3 that are interconnected by a bus 638. Controller circuit 631 includes an input/output (I/O) interface circuit 632 that facilitates sending and receiving commands and data to/from a host (not shown) into which MMC/SD core unit 600 is plugged. Controller circuit 631 also includes a flash-memory controller 634 that facilitates sending and receiving sends data over one or more internal flash buses 638 to/from flash mass storage blocks 635-1, 635-2, 635-3. Because internal flash bus 638 is internal to single-chip controller/flash die 630, external pins are not required for the interface to flash memory blocks 635-1, 635-2, 635-3. In one embodiment, flash mass storage blocks 635-1, 635-2, 635-3 are not randomly accessible. Instead, a command and an address are transferred as data over internal flash bus 638 to indicate a block of data to transfer from flash mass storage blocks 635-1, 635-2, 635-3. Thus, flash mass storage blocks 635-1, 635-2, 635-3 are block-addressable mass storage, rather than random-access memory (RAM). In another embodiment, flash mass storage blocks 635-1, 635-2, 635-3 are aggregated together by the flash microcontroller of controller circuit 631, which maps and directs data transactions to selected flash storage blocks 635-1, 635-2, 635-3. Because the flash microcontroller 631 performs memory management, flash storage blocks 635-1, 635-2, 635-3 appear as a single, contiguous memory to external hosts. Additional details regarding the use of single-chip controller/flash die 630 is provided in co-owned U.S. Pat. No. 7,103,684, which is incorporated herein by reference in its entirety.

Figure 21:
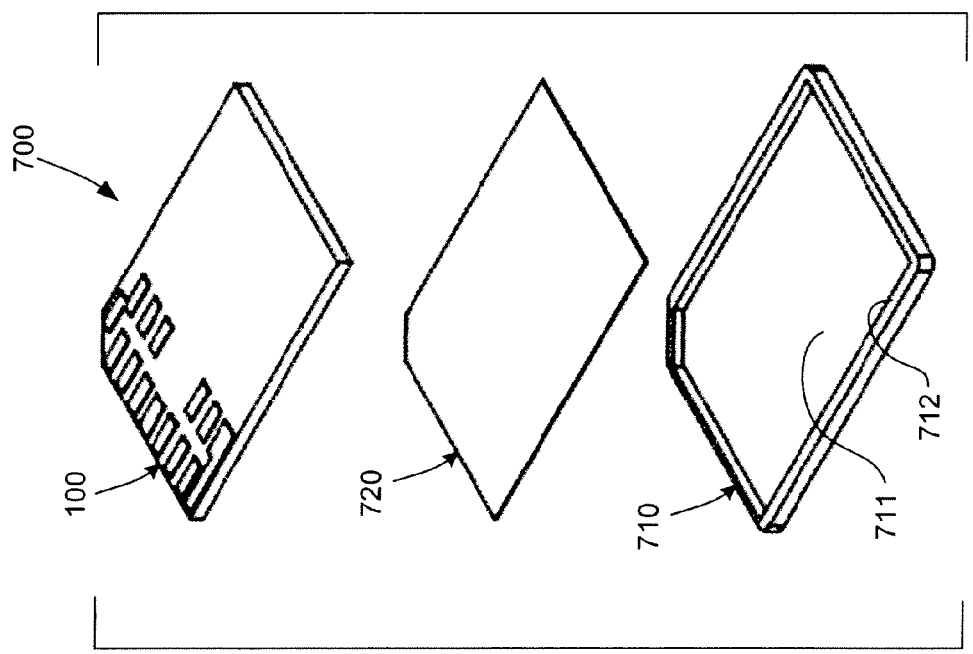
FIG. 21 is an exploded perspective view showing an MMC device including the MMC core unit of FIG. 17(A) and an outer case according to another embodiment of the present invention.
Figure 22:
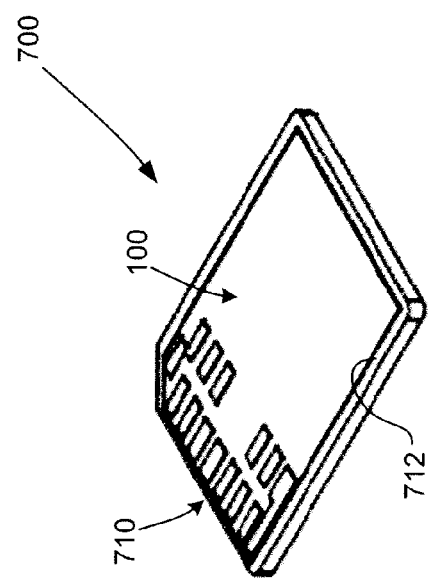
FIG. 22 is a perspective view showing the MMC device of FIG. 21 in an assembled state.

Referring to block 280 located near the bottom of FIG. 3, marked MMC core unit 100 is then assembled with an external casing to provide a finished MMC device. FIG. 21 is an exploded perspective view showing an MMC device 700 that includes MMC/SD core unit 100 (which can be replaced using any of the embodiments described above) and a metal or synthetic plastic casing 710. Casing 710 is a box-like structure having a flat lower wall 711 and a peripheral wall 712 that extends upward from lower wall 711. Casing 710 does not include a top cover. The external dimensions of casing 710 conform to standard MMC form factor. The assembly of MMC core unit 100 involves applying a double sided thermal adhesive tape 720 onto flat lower surface 711 inside the cavity defined by casing 710. MMC core unit 100 is then placed on the top surface of double sided thermal adhesive tape 720 such that the planar lower surface of the plastic housing presses against the lower wall 711 by way of the double sided thermal tape 720, and such that the peripheral wall 712 of casing 710 extends over the side walls of the plastic housing. The assembled final MMC device 700 is as shown in FIG. 22. Final MMC device 700 is optionally subjected to a temperature bake to enhance the adhesiveness of double sided thermal adhesive tape 720.

Referring to block 290 located at the bottom of FIG. 3, a final procedure in the manufacturing method of the present invention involves testing, packing and shipping the individual MMC/SD devices. The assembled devices 700 shown in FIG. 22 are then subjected to visual inspection and electrical tests consistent with well established techniques. Visually or/and electrically test rejects are removed from the good population as defective rejects. The good memory cards are then packed into custom made boxes which are specified by customers. The final packed products will ship out to customers following correct procedures with necessary documents. In an alternative embodiment, electrical testing may be performed before final assembly.

As suggested in the above example, in addition to providing a highly cost effective method for producing MMC devices, the present invention may be used to produce SD devices as well. The process described above with reference to the production of MMC devices is substantially identical to the production of SD devices, with notable exceptions identified below.

Figure 23:
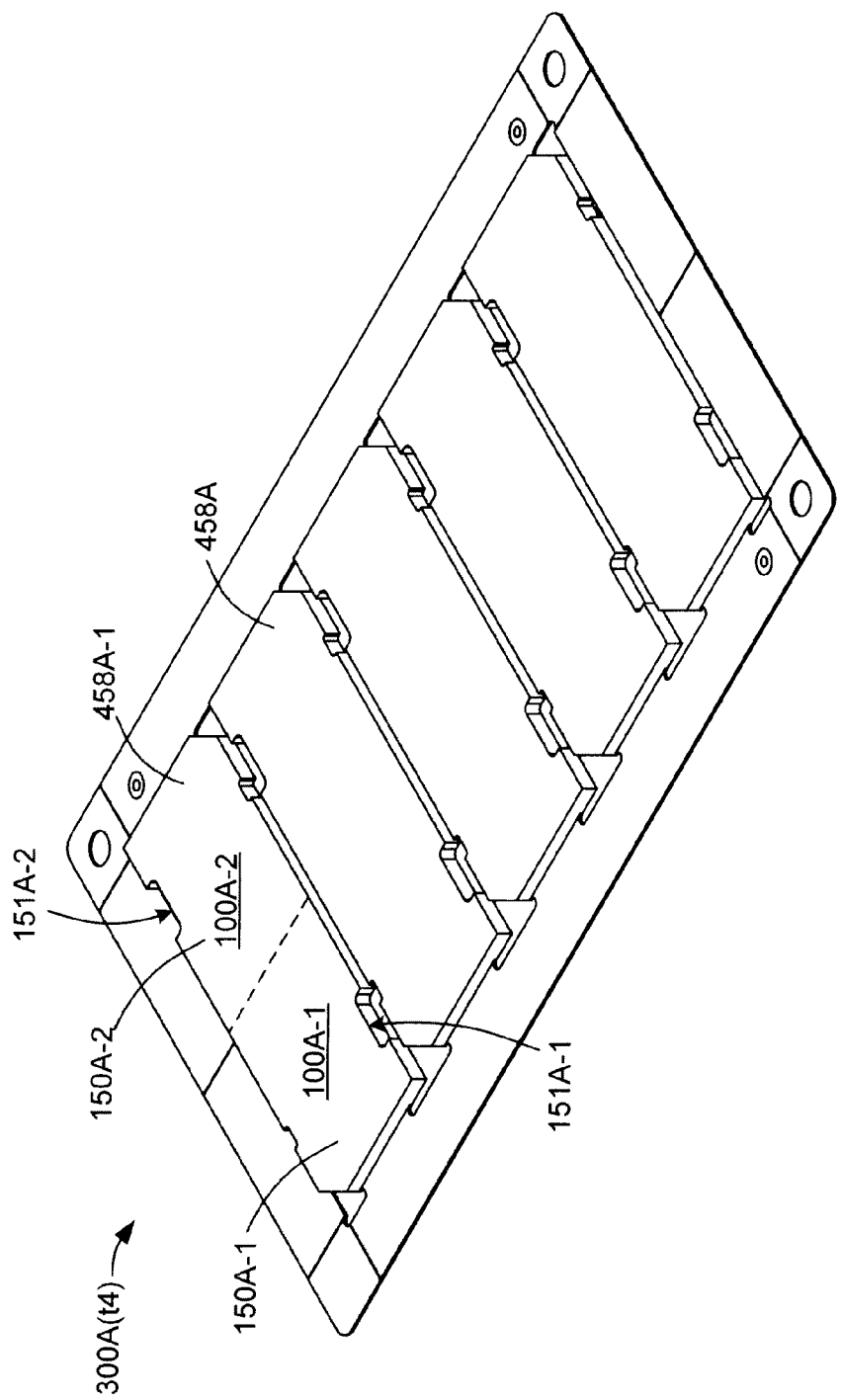
FIG. 23 is a top perspective views showing a PCB panel utilized in the production of the SD core unit of FIG. 1(B) after a molding process is completed.

First, as indicated in FIG. 23, the plastic mold for forming SD core units is modified using known techniques to produce five separate molding layers 458A on a corresponding PCB panel 300A(t4) such that each molding layer 458A is formed over two SD core units such that write protect notches are formed by the molding process in the side wall of each plastic housing. For example, molding layer 459A-1 include plastic housing 150A-1 formed over SD core unit 100A-1 and plastic housing 150A-2 formed over SD core unit 100A-2. Plastic housings 150A-1 and 150A-2 respectively include write protect notches 151A-1 and 151A-2 (along with other features associated with SD devices).

Figure 25:
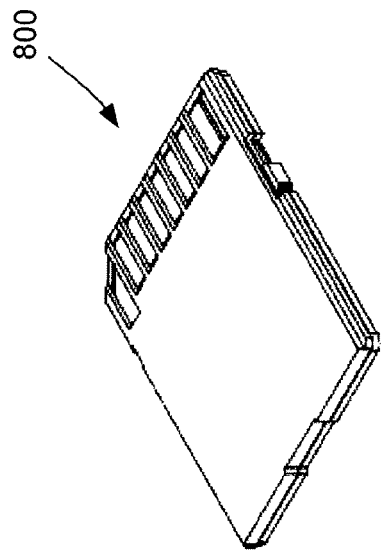
FIG. 25 is a perspective view showing the SD device of FIG. 24 in an assembled state.
Figure 24:
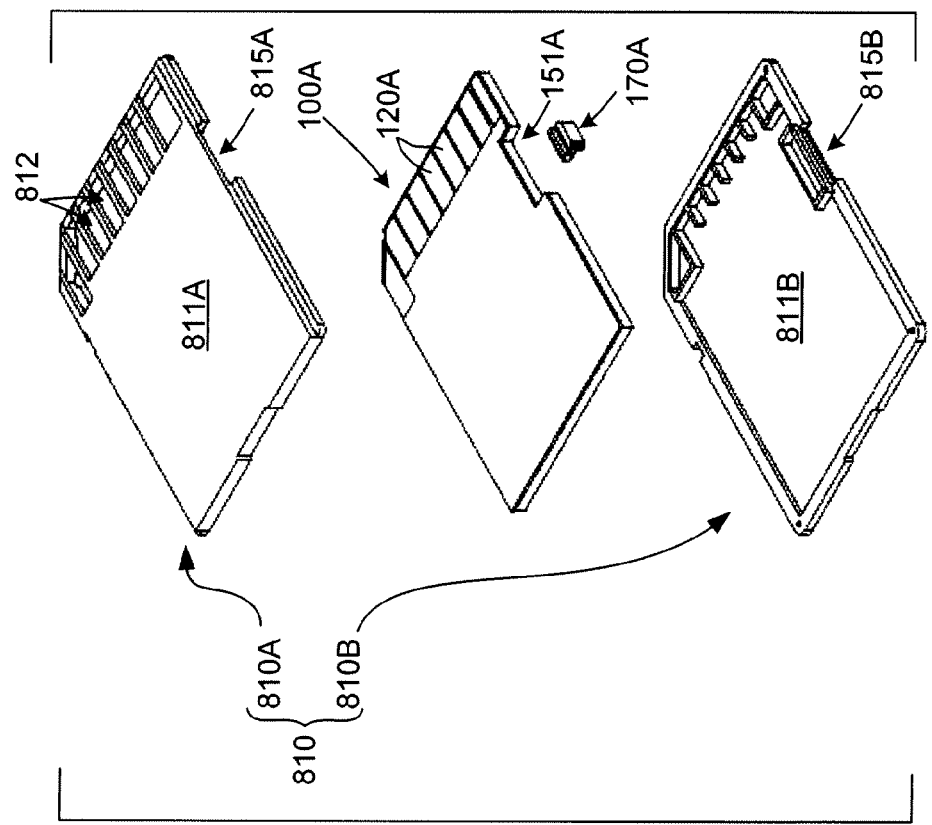
FIG. 24 is an exploded perspective view showing an SD device including the SD core unit of FIG. 1(B) and an outer case according to another embodiment of the present invention.

Second, as indicated in FIGS. 24 and 25, the final assembly process for SD devices 800 includes inserting SD core unit 100A inside an external plastic (or metal) casing 810. FIG. 24 is an exploded perspective view showing that casing 810 includes a top cover 810A and a bottom cover 810B that collectively have external dimensions conforming to the standard SD form factor. Top cover 810A is a box-like structure having a flat top wall 811A defining openings 812 for exposing metal contacts 120A of SD core unit 100A, and a peripheral wall that includes a write protect feature 815A. Similarly, bottom cover 810B has a flat bottom wall 811B having a peripheral wall that includes a switch cavity slot 815B. A small plastic switch tablet 170A is placed in the switch cavity slot 815B after SD core unit 100A is placed snugly in the cavity of bottom cover 810B. The peripheral wall of top cover 810A is then secured to the peripheral wall of bottom cover 810B using one of: a) an ultrasonic press method, b) an adhesive epoxy, c) a snap-on method, or d) a second step over-molding method. The completed final SD device 800 is as shown in FIG. 24.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A MMC/SD flash memory device comprising:
   a core unit including:
      a printed circuit board assembly (PCBA) including:
         a printed circuit board (PCB) having opposing first and second surfaces,
         a plurality of metal contacts disposed on the first surface of the PCB,
         at least one passive component mounted on the second surface of the PCB,
         at least one unpackaged integrated circuit (IC) die mounted on the second surface of the PCB, and
         a plurality of conductive traces formed on the PCB such that each conductive trace is electrically connected to at least one of an associated metal contact, said at least one IC die and said at least one passive component; and
      a single-piece molded housing formed on the second surface of the PCBA such that said at least one passive component, said at least one IC die, and all remaining exposed portions of the second surface are covered by said molded housing, and such that substantially all of the first surface of the PCB is exposed; and
   an external casing mounted onto the core unit such that the metal contacts are exposed,
   wherein the molded housing includes a planar surface extending parallel to the PCB, and
   wherein the molded housing includes a peripheral wall extending perpendicular to the planar surface, and wherein the peripheral wall is aligned with a peripheral edge of the PCB.

2. The MMC/SD flash memory device of claim 1, wherein the at least one integrated circuit (IC) die is electrically connected to the conductive traces by a plurality of wire bonds extending between said at least one IC die and corresponding contact pads disposed on the second surface of the PCB.

3. The MMC/SD flash memory device of claim 2, wherein the at least one passive component includes a lead that is soldered to a corresponding contact pad disposed on the second surface of the PCB.

4. The MMC/SD flash memory device of claim 3, wherein the at least one passive component comprises at least one of a resistor and a capacitor.

5. The MMC/SD flash memory device of claim 2, wherein the at least one integrated circuit (IC) die includes a first IC die comprising a controller circuit, and a second IC die comprising a flash memory circuit.

6. The MMC/SD flash memory device of claim 5, wherein the at least one integrated circuit (IC) die comprises a plurality of flash memory dies disposed in a stacked arrangement such that a first flash memory die is mounted on the second surface of the PCB, and a second flash memory die is mounted on a surface of the first flash memory die.

7. The MMC/SD flash memory device of claim 6, wherein the first flash memory die is connected to said PCB by a first plurality of said wire bonds, and the second flash memory die is connected to one of the first flash memory die and said PCB by a second plurality of wire bonds.

8. The MMC/SD flash memory device of claim 2, wherein the at least one integrated circuit (IC) die includes a single-chip controller/flash die comprising controller circuit and one or more flash block mass storage circuits that are interconnected by a bus.

9. The MMC/SD flash memory device of claim 1, wherein the external casing comprises a box-like structure having a flat lower wall and a peripheral wall that extends upward from the bottom wall, and wherein the core unit is inserted into the external casing such that a planar lower surface of the molded housing presses against the flat lower wall, and such that the peripheral wall of the casing extends over side walls of the molded housing.

10. The MMC/SD device of claim 9, wherein the casing further comprises a thermal adhesive tape disposed between the planar lower surface of the molded housing and the flat lower wall of the casing.

11. The MMC/SD flash memory device of claim 1,
wherein the external casing comprises a box-like top cover having a flat top wall defining openings and a first peripheral wall, and a bottom cover having a flat bottom wall having a second peripheral wall, and
wherein the core unit is inserted into the external casing such that the metal contacts of are exposed through the openings defined in the flat top wall, a planar lower surface of the molded housing presses against the flat bottom wall, and such that the first and second peripheral walls extend over side walls of the molded housing.

12. The MMC/SD flash memory device of claim 11, wherein the top cover is secured to the bottom cover by one of ultrasonic welding, an adhesive epoxy, a snap-on structure, and an over-molding process.

13. The MMC/SD flash memory device of claim 11, wherein the external casing further comprises a plastic switch tablet that is slidably engaged in a switch cavity slot defined in the bottom cover.

14. A method for producing an MMC/SD flash memory device comprising:
producing a printed circuit board (PCB) including opposing first and second surfaces, a plurality of metal contacts disposed on the first surface, a plurality of first contact pads disposed on the second surface, a plurality of second contact pads disposed on the second surface, and a plurality of conductive traces formed on the PCB such that each conductive trace is electrically connected to at least one of an associated metal contact, a first contact pad and a second contact pad, wherein producing the PCB comprises forming a PCB panel including at least ten of said PCBs arranged in two rows;
attaching at least one passive component to the first contact pads of each of said at least ten of said PCBs using a surface mount technique;
attaching at least one unpackaged integrated circuit (IC) die to the second contact pads of each of said at least ten of said PCBs using a chip-on-board technique;
forming a single-piece molded housing on the second surface of all of said at least ten of said PCBs such that said at least one passive component and said at least one IC die of all of said at least ten of said PCBs are covered by a uniform block formed by said molded housing, and such that substantially all of the first surface of each of said at least ten of said PCBs is exposed;
singulating said PCB panel such that a portion of the molded housing remains on each of said at least ten of said PCBs, such that said molded housing portion includes a peripheral wall extending perpendicular to said each of said at least ten of said PCBs, and such that the peripheral wall is aligned with a peripheral edge of said each of said at least ten of said PCBs, thereby forming at least ten core units; and
mounting each of said at least ten core units onto an associated external casing.

15. The method of claim 14, wherein attaching said at least one passive component comprises:
printing a solder paste on said first contact pads;
mounting said at least one component on said first contact pads; and
reflowing the solder paste such that said at least one component is fixedly soldered to said first contact pads.

16. The method of claim 14, further comprising grinding a wafer including said at least one IC die such that a thickness of said wafer is reduced during said grinding, and then dicing said wafer to provide said at least one IC die.

17. The method of claim 16, wherein attaching at least one IC die comprises bonding said at least one IC die to the second surface of the PCB and wire bonding the at least one IC die to said second contact pad.

* * * * *